(12) United States Patent
Suzuki

(10) Patent No.: US 6,537,469 B1
(45) Date of Patent: Mar. 25, 2003

(54) DISCHARGE COUNTER AND A NONLINEAR RESISTANCE MATERIAL FOR A DISCHARGE COUNTER

(75) Inventor: Hironori Suzuki, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 20 days.

(21) Appl. No.: 09/717,285

(22) Filed: Nov. 22, 2000

Related U.S. Application Data

(62) Division of application No. 09/264,676, filed on Mar. 9, 1999, now Pat. No. 6,208,496.

(30) Foreign Application Priority Data

Mar. 11, 1998 (JP) ............................................ 10-059562

(51) Int. Cl.$^7$ ................................................. H01B 1/08
(52) U.S. Cl. ............................. 252/519.52; 252/519.51
(58) Field of Search ........................ 252/519.51, 519.52

(56) References Cited

U.S. PATENT DOCUMENTS

| | | | |
|---|---|---|---|
| 3,999,159 A | | 12/1976 | Matsuura et al. ............. 338/21 |
| 4,326,187 A | | 4/1982 | Miyoshi et al. ............... 338/21 |
| 4,996,510 A | | 2/1991 | Becker et al. ................. 338/21 |
| 5,107,242 A | * | 4/1992 | Imai et al. ..................... 338/21 |
| 5,277,843 A | * | 1/1994 | Imai et al. ................... 252/518 |
| 5,594,406 A | | 1/1997 | Koyama et al. ............... 338/21 |
| 5,811,033 A | * | 9/1998 | Itoh et al. ............... 252/519.51 |
| 6,146,552 A | * | 11/2000 | Iga et al. .................. 252/519.5 |

FOREIGN PATENT DOCUMENTS

| | | |
|---|---|---|
| JP | 2519538 | 9/1996 |
| JP | 10-241910 | 9/1998 |
| JP | 10-241911 | 9/1998 |

* cited by examiner

*Primary Examiner*—Mark Kopec
(74) *Attorney, Agent, or Firm*—Oblon, Spivak, McClelland, Maier & Neustadt, P.C.

(57) ABSTRACT

A nonlinear resistance composition comprising:
  zinc oxide as a major component;
  bismuth oxide present at 0.1–5.0: mol % of said zinc oxide,
  titanium oxide present at 0.1–5.0: mol % of said zinc oxide, and
  silver oxide present at $0.5*10^{-3}$–$20*10^{-3}$: mol % of said zinc oxide.

Such nonlinear resistance components can further comprise antimony oxide, cobalt oxide, manganese oxide, nickel oxide, aluminum oxide and/or boric oxide.

8 Claims, 11 Drawing Sheets

Fig.9
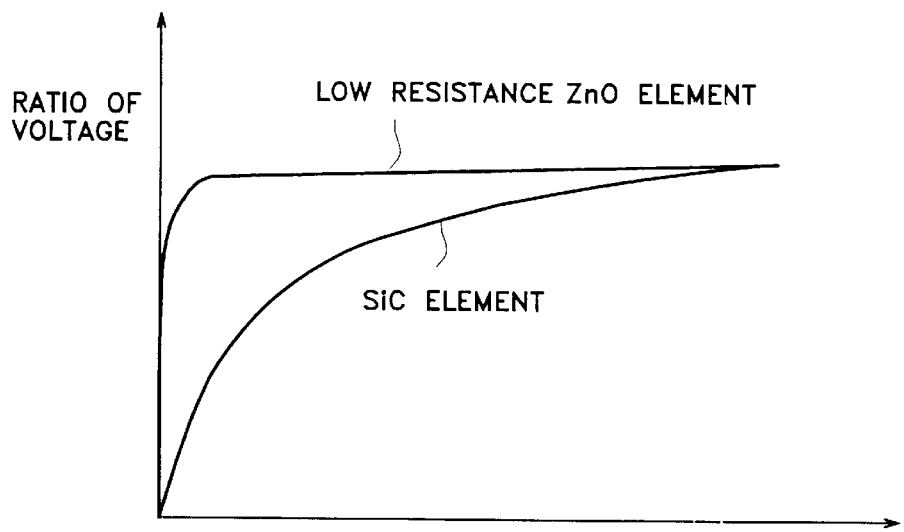
Fig.10
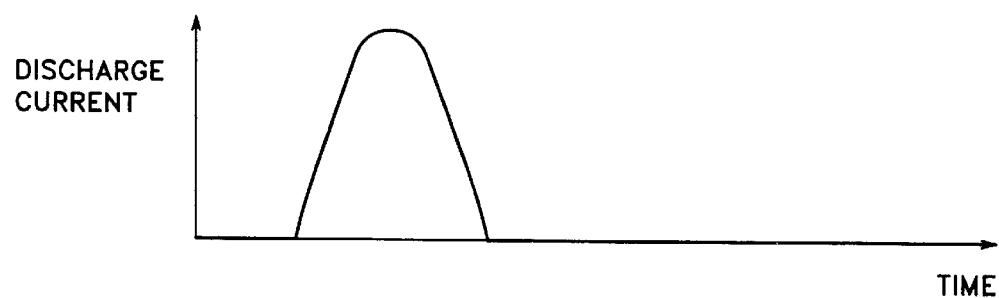
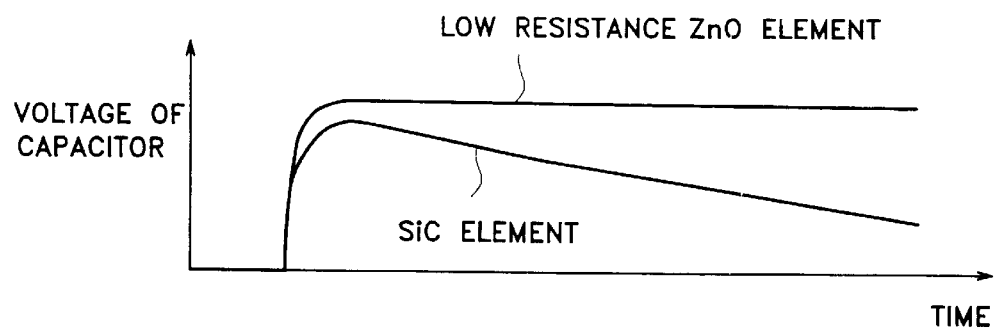

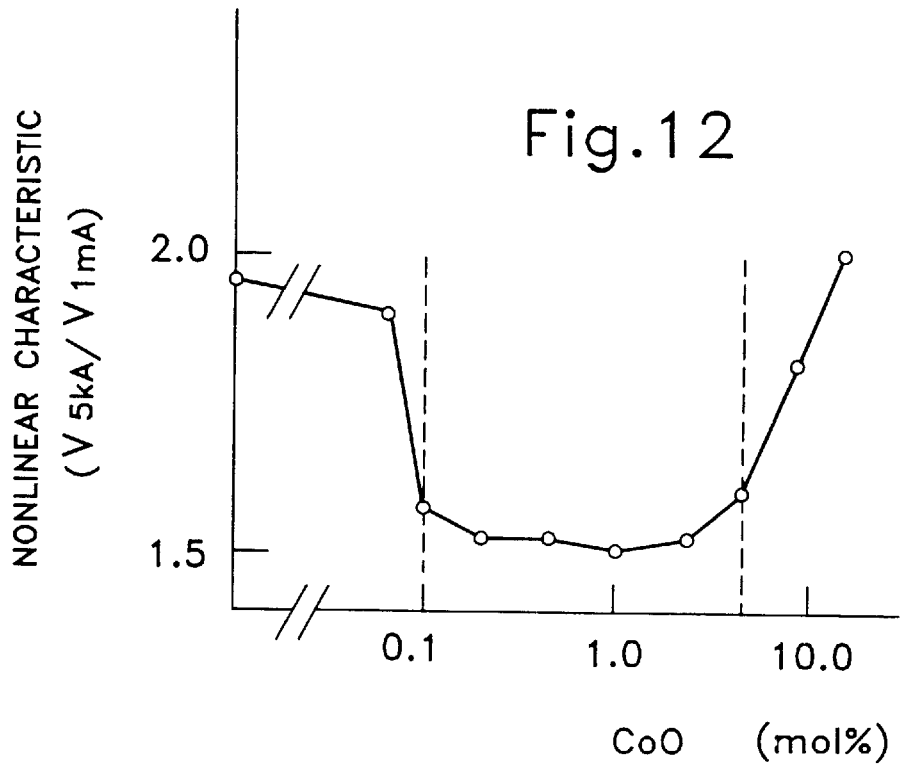
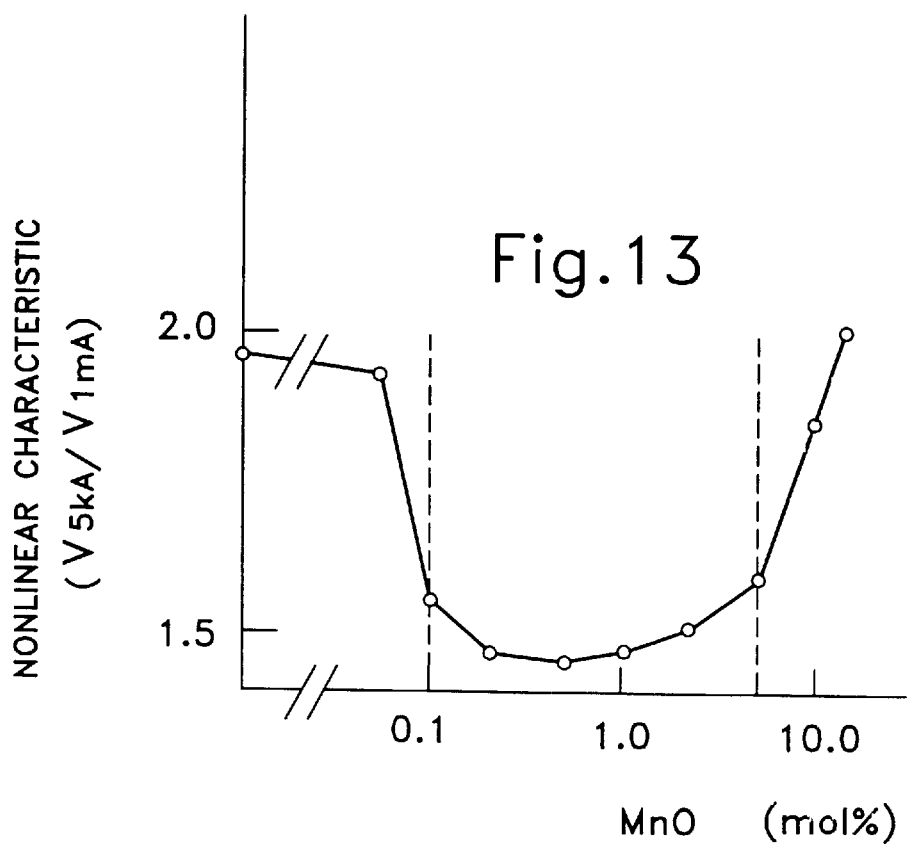

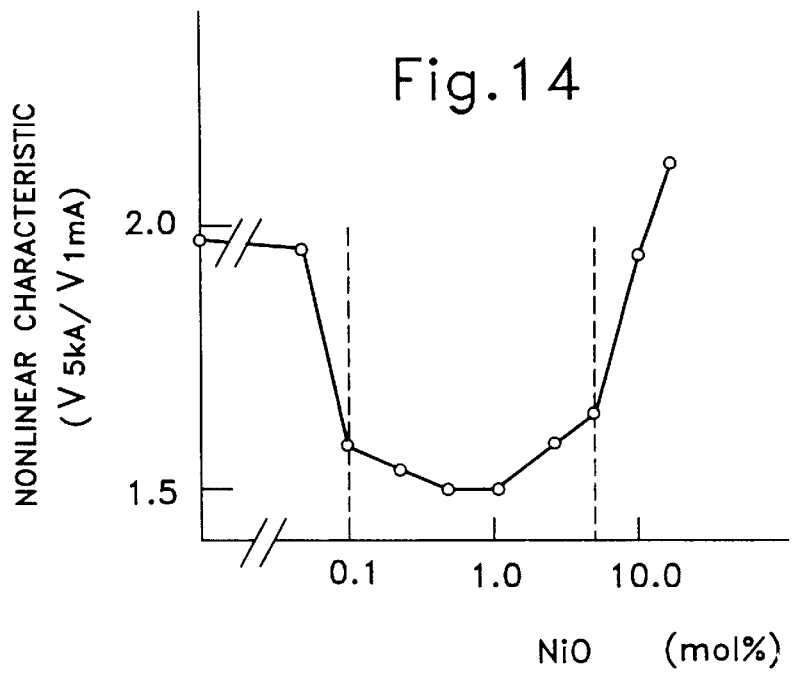
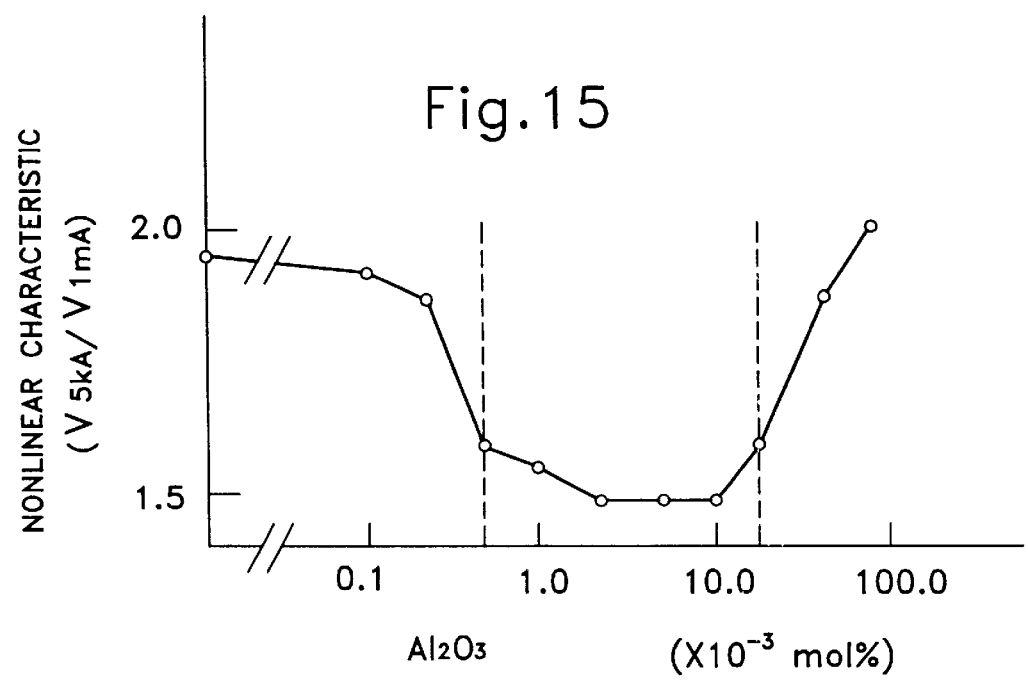

DISCHARGE COUNTER AND A NONLINEAR RESISTANCE MATERIAL FOR A DISCHARGE COUNTER

This application is a Division of application Ser. No. 09/264,676 filed on Mar. 9, 1999 U.S. Pat. No. 6,208,496.

BACKGROUND OF THE INVENTION

1. Field of the Invention

The present invention relates to a discharge counter to ascertain the operation of a lightening arrester to protect a power system and a electric apparatus from overvoltage.

The present invention further relates to a nonlinear resistance element developed for the discharge counter.

2. Description of the Related Art

In general, an overvoltage protection instrument such as an arrester or a surge absorber has been employed in power system and electrical circuits.

A nonlinear resistor, having a nonlinear resistance characteristic at 1 normal voltage but exhibiting a low resistance value during overvoltage, works in such as instrument.

For example, FIG. 19 shows a conventional discharge counter which adopts a carbon silicon (hereinafter referred to as "SiC") element as a nonlinear resistor. The discharge counter includes SiC elements 160a–160c, a capacitor 170, a counter 30, a G1 gap 180a, a G2 gap 180b, and a lightening arrester terminal 40. Between the lightening arrester terminal 40 and a grounding terminal 50, the SiC element 160a and the capacitor 170 are connected in series. The series circuit of the SiC element 160b and the capacitor 170 are connected in parallel with a serial circuit of the G1 gap 180a, the $G_2$ gap 180b. These circuits are the parallel circuit.

The SiC element 160c is provided between an intermediate electrode 180c and the grounding terminal 50. The capacitor 170, the SiC element 160c and the counter 30 are connected in a parallel circuit.

In the discharge counter constructed as described, the action of the lightening arrester LA causes the discharge current to flow into the discharge counter from the lightening arrester terminal 40. This discharge current flows into the ground through the SiC element 160a, the SiC element 160b and the grounding terminal 50. Then, the capacitor 170 is charged by the voltage generated based on the IR drop between both terminals of the SiC element 160b.

After the charging of the capacitor 170, the counter 30 is operated by discharging all or part of the charged energy of the capacitor 170.

Completion of the charging of the capacitor 170 is judged by the following phenomenon. If the discharge current of the lightening arrester LA is small, the completion of the charging of the capacitor 170 is judged by the crest value. If the discharge current of the lightening arrester LA is large, the completion of the charging of the capacitor 170 is judged by the time of a discharge through a short circuit between the G1 gap 180a and the G2 gap 180b in the rising process of the discharge current.

The crest value means the maximum value of the current or voltage in the surge impulse. For example, both the G1 gap 180a and the G2 gap 180b do not short in the EXAMPLE of a small current. When the current increases, the G1 gap 180a is also discharged by residual voltage of both the GI gap 180a and $G_2$ gap 180b. The discharge current flows into the ground through the SiC element 160c.

The residual voltage means the voltage remaining between both terminals by restricting the overvoltage during discharging. The residual voltage is determined by both the crest value and the waveform of the discharge current. Even when the current increases, the G1 gap 180a also discharges based on the residual voltage of the SiC 160C.

In the above mentioned discharge counter, because the discharge tolerance of the SiC element, as the nonlinear resistance, is small, there is a possibility that the element is destroyed by momentarily large current. Here, the discharge tolerance means the maximum current of the nonlinear resistance which does not trouble the lightening arrester. Accordingly, the protective gap for a by-pass or the parallel circuit composed of SiC elements is adopted to prevent the destruction of the element.

However, a structure like this presents a problem that the size of the discharge counter gets larger due to the needs of the many elements. Further the residual voltage will be high during momentarily large current flows, because the nonlinear resistance characteristic is poor. For example, the residual voltage of 7000V is generated when a discharge current of 10 KA flows. As a result, the size of the discharge counter could be large to increase the tolerance voltage of each element. In particular, if the momentary discharge current is over 20 KA, the counter 30 does not function because of insufficiently charged necessary energy in the capacitor due to discharging of the gap. This influences reliability.

Even, if this discharge counter is connected to the lightening arrester of a low voltage class (3 kv, 6 kv: for electric rail car), a high terminal voltage is generated between both terminals of the discharge counter based on the residual voltage of the SiC element when a large current from the lightening arrester flows into the discharge counter. This terminal voltage which is added to the residual voltage generated at the lightening arrester, may surpass the standardized residual voltage of the lightening arrester and may not protect the peripheral apparatus.

Accordingly, instead of the SiC element, a zinc oxide element (hereinafter referred to as "ZnO element") can be adopted in the discharge counter.

However, the size of the ZnO element gets large and requires a large size element (for example, with a diameter of 100 mm) the same as the lightening arrester, though the discharge tolerance is larger than that of the SiC element. The ZnO element as the nonlinear resistance, has the characteristic that the operating starting voltage per a thickness of 1 mm is approximately 200V, which is high. A by-pass resistor will, therefore, be needed to overcome the mentioned problems, but it must be large.

The nonlinear resistance is expected to have the range of 20–150 (v/mm) because of the following reasons:

When the varistor voltage is less than 20 (v/mm), the size of the element will be large to get the preferred residual voltage.

When the varistor voltage is more than 150 (v/mm), improvement of the discharge tolerance characteristic will not be expected because it is impossible to increase the thickness of the nonlinear resistor.

Accordingly, the thickness of the ZnO element should be from 1 mm to 2 mm in order to perform with residual voltage less than 1000V on the V–I characteristic. It is, however, very difficult to adjust the mentioned thickness using the ZnO element.

SUMMARY OF THE INVENTION

It is an object of the present invention to provide a discharge counter having simple components and high reliability.

It is also an object of the present invention to provide a nonlinear material four the discharge counter, which has excellent characteristics, such as a discharge tolerance characteristic, a life time characteristic, and low varistor voltage.

Here, varistor voltage means the voltage of a semiconductor element having a nonlinear characteristic the resistance of which is changed by voltage in nonlinear line.

BRIEF DESCRIPTION OF THE DRAWINGS

A more complete appreciation of the invention and many of the attendant advantage thereof will be readily obtained and better understood by reference to the following detailed description when considered in connection with the accompanying drawings.

FIG. 9 is a graph showing a relationship between a ratio of voltage and current of a crest value.

FIG. 10 is a graph showing a relationship between a capacitor voltage and a time of crest value.

FIG. 12 is a graph showing the relationship between a nonlinear characteristic and on increasing in the amount of a CoO.

FIG. 13 is a graph showing the relationship between a nonlinear characteristic and on increasing in the amount of a MnO.

FIG. 14 is a graph showing the relationship between a nonlinear characteristic and on increasing in adding the amount of a NiO.

FIG. 15 is a graph showing the relationship between a nonlinear characteristic and on increasing in the amount of a $Al_2O_3$.

DETAILED DESCRIPTION OF THE PREFERRED EMBODIMENT

Embodiments of the discharge counter and the nonlinear resistance for the discharge counter according to the present invention will not be explained in detail with reference to the accompanying drawings.

(1) First Embodiment

A discharge counter according to a first embodiment of the present invention will now be described with reference to FIG. 1.

Figure 1:
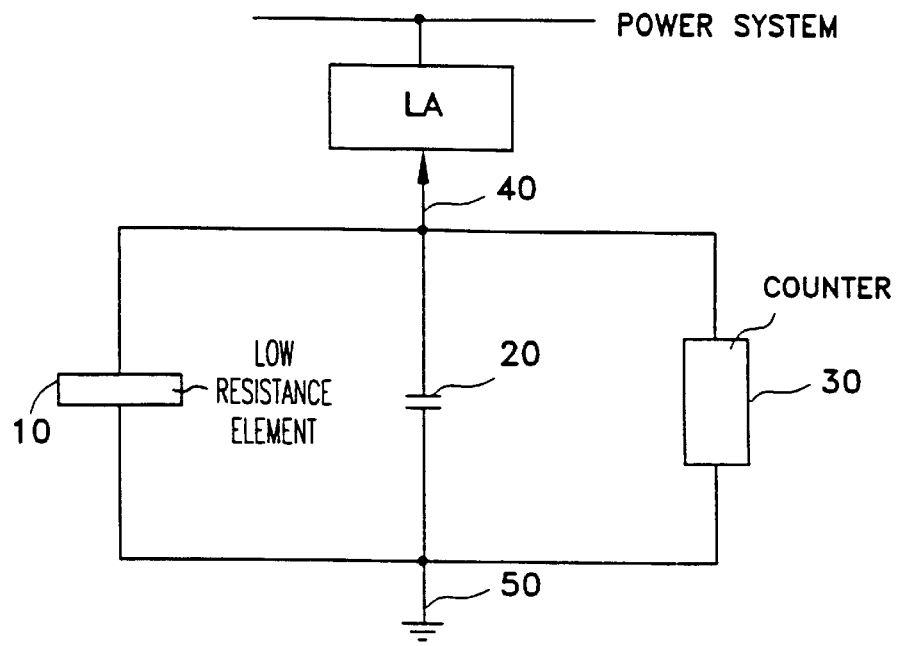
FIG. 1 is a circuit diagram of a discharge counter according to a first embodiment of the present invention.

In FIG. 1, the discharge counter includes a low resistance ZnO element 10, a capacitor 20, a counter 30, a lightening arrester terminal 40, and a grounding terminal 50.

The low resistance ZnO element 10 has a characteristic that the operating starting voltage is in the range of 20–50 (v/mm), lower than the range of 200 (v/mm) of the conventional ZnO elements with reference to JAPANESE PATENT DISCLOSURE(KOKAI) No.H9-43808.

To begin with, the material of the low resistance ZnO element as a nonlinear resistance is formed by adding bismuth oxide (hereinafter referred to as "$Bi_2O_3$"), antimony oxide (hereinafter referred to as "$Sb_2O_3$"), and titanium oxide (hereinafter referred to as "$TiO_2$") as metal oxide to zinc oxide (hereinafter referred to as "ZnO") as a main component.

It is possible to increase the thickness under the varistor voltage (20–50 (v/mm)) and improve the discharge tolerance characteristic of the low resistance ZnO element by adopting the following range (calculated as "$Bis_2O_3, TiO_2, Sb_2O_3$") for each component.

$Bi_2O_3, TiO_2, Sb_2O_3$: 0.1–5.0: mol %

The expression of "mol %" means the quantity of a particular material included in 1 mol(the Avogadro's constant{about $6.0221367*10^{23}$}). For example, $Bi_2O_3$(1 mol %) means that the number calculated as $Bis_2O_3$ is 6.2.

The same explanation (mol %) applies to the embodiments mentioned later.

In this EXAMPLE, the ratio of ZnO is in the range of 7.0–22.7 (mol %). According to the mentioned composition, the varistor voltage will be set at 20–50 (v/mm), and it is possible to improve the discharge tolerance characteristic because of the thickening the nonlinear resistance.

The detailed explanation will be done in the embodiments related to the nonlinear resistance mentioned later.

A counter 30, which functions whenever the charged energy of the capacitor 20 is discharged functions (for example, through a dig representation) to display the calculated value.

In this, the low resistance ZnO element 10, the capacitor 20 and the counter 30 comprises a parallel circuit. One side of this circuit is connected to the lightening arrester terminal 40, the lightening arrester LA in series, and the other end of this circuit is connected to the ground.

In this discharge counter, the discharge current from the lightening arrester LA and the lightening arrester terminal 40, flows into ground through the low resistance ZnO element 10 and the grounding terminal 50. Then, the capacitor 20 is charged by the generation of voltage based on the IR drop at the low resistance ZnO element 10. After the charging of the capacitor 20, the counter functions by discharging the charged energy of the capacitor 20. A leakage current (several mA) from the lightening arrester LA flows into the capacitor 20, and does not flow into the low resistance ZnO element 10.

Figure 7:
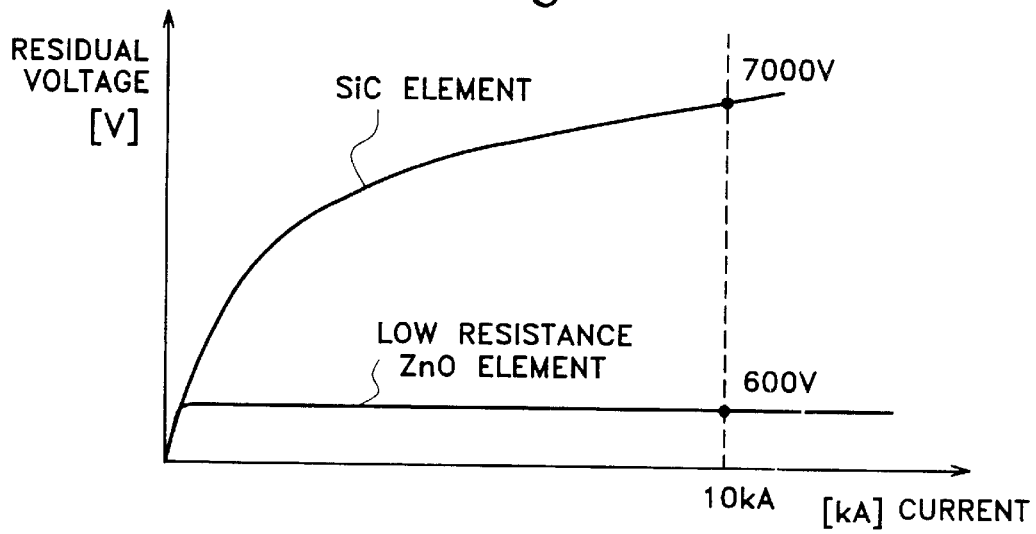
FIG. 7 is a graph showing a relationship between voltage and current.
Figure 19:
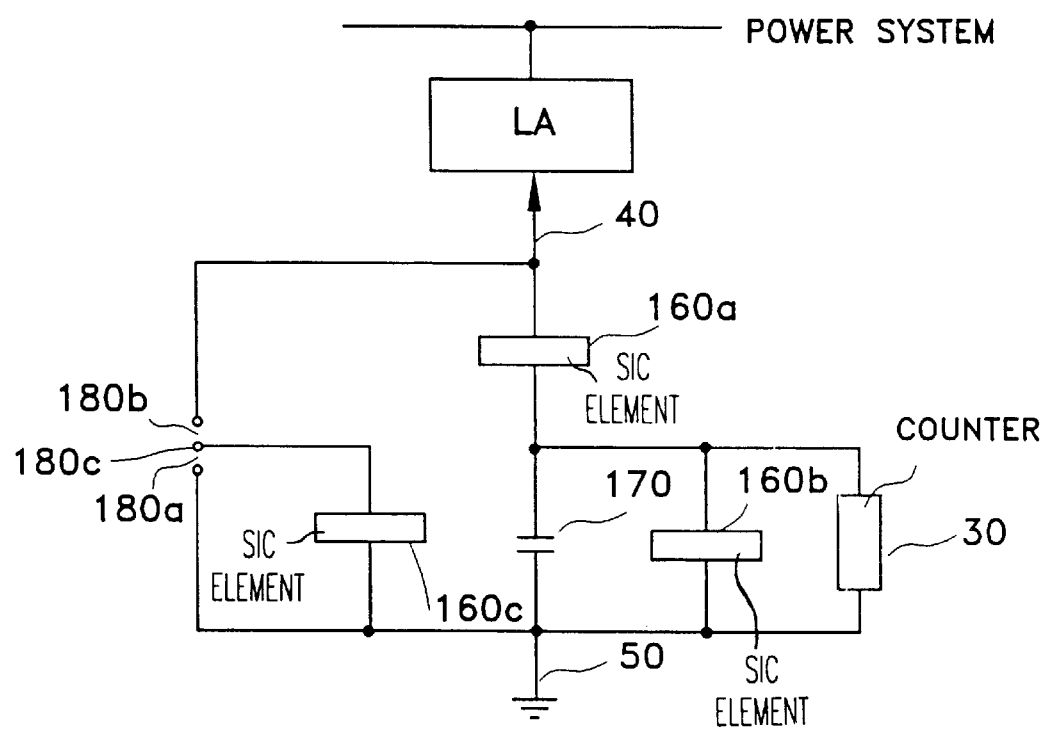
FIG. 19 is a circuit diagram of a conventional discharge counter.

FIG. 7 is a graph showing the relationship between residual voltage and current. According to FIG. 7, the residual voltage of the low resistance ZnO element 10 is approximately 600V, which is lower than that (7000V) of the SiC element under the current of 10 kA. This shows that the low resistance ZnO element is superior to the SiC element in the residual voltage. Accordingly, the low resistance ZnO element 10 is directly connected to a capacitor, which has a tolerance voltage of 1000V for public use in parallel, and both the G1 gap 180a and the G2 gap 180b in FIG. 19 are unnecessary.

Furthermore, connecting the low resistance ZnO element 10 between the lightening arrester terminal 40 and the grounding terminal 50 enables the terminal voltage between the lightening arrester terminal 40 to reduce the voltage and form a parallel circuit with capacitor 20, and counter 30.

Accordingly, the first embodiment referring to the discharge counter can achieve the following effects:

1) As the terminal voltage of the discharge counter is a relatively low voltage (less than about 600V), the lightening arrester of a low voltage class (3 kv, 6 kv for a electric rail car) can be applied.

2) Miniaturization and improvement of reliance is ascertained by omitting the protective bypass gap and reducing element, and by simplifying the circuit.

3) The size of the low resistance is smaller than a conventional element.

4) Less energy is consumed than in the conventional elements during large current impulse (for example, 100 kA) because the residual voltage is lower than the conventional element.

Furthermore, according to tests by inventors, a diameter of 47 mm can be applied.

5) The sensitivity of a momentary impulse current is improved.

Figure 8:
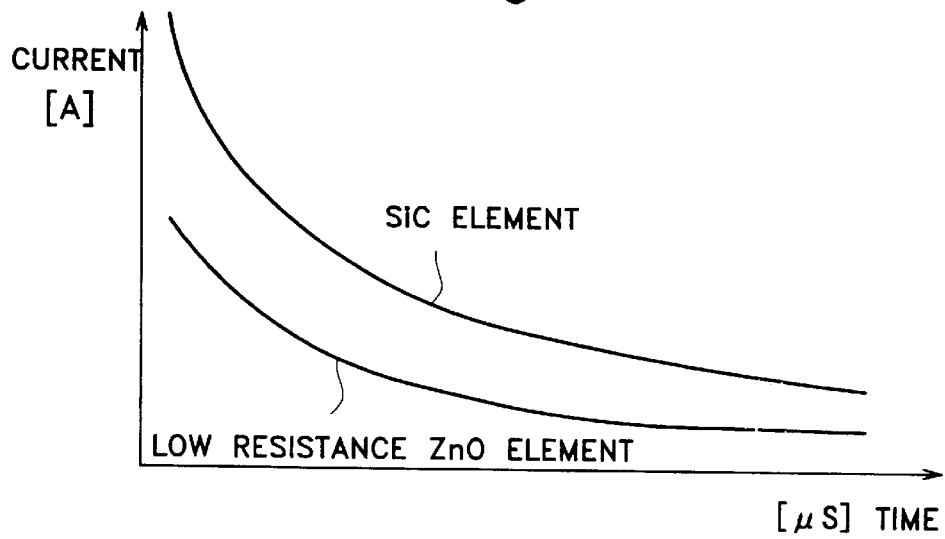
FIG. 8 is a graph showing a relationship between voltage and current of a crest value.

FIG. 8 is a graph showing the relationship between the lowest operating discharge current and the time of duration of wave front. The vertical axis shows lowest operating current, and the horizontal axis shows the time of duration of wave front.

FIG. 8 also expresses the characteristic between a lowest operating current and the horizontal axis shows the time of duration of wave front when the lightening arrester discharges by adding the impulse voltage.

According to FIG. 8, the improvement of the sensitivity of the lowest operating current of the low resistance ZnO element 10 is ascertained in comparison with the SiC element.

Here, the time of duration of wave means the time that a discharge current reaches the crest value. The shorter this time is, the better the sensitivity is.

The effect of (4) is explained hereinafter with reference to FIG. 9 and FIG. 10.

FIG. 9 is a graph showing the relationship between the ratio of the voltage and the current of the crest value. According to FIG. 9, the current which flows in the low resistance ZnO element is less than that of the SiC element under a low current. That is to say, the low resistance ZnO element has the nonlinear characteristic that no current flows before the added voltage reaches the protective level (overvoltage).

FIG. 10 is a graph showing a relationship between the capacitor voltage and the time of the crest value. Adopting the SiC element, the energy for it to function is not charged and the sensitivity of the operating current deteriorates, compared to the low resistance ZnO element.

(2) Second Embodiment

Figure 2:
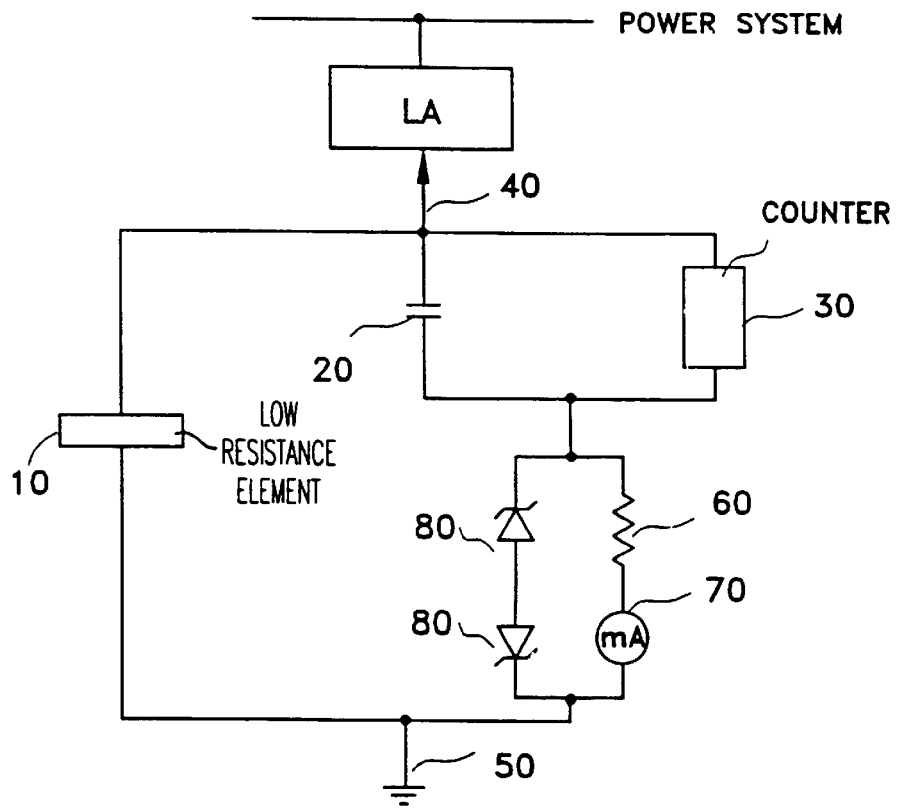
FIG. 2 is a circuit diagram of a discharge counter according to a second embodiment of the present invention.

FIG. 2 is a circuit diagram of the discharge counter based on the second embodiment.

In FIG. 2, the explanation about the low resistance ZnO element 10, the capacitor 20, counter 30, the lightening arrester terminal 40, and the grounding terminal 50 is omitted because these elements are same as in FIG. 1.

The difference with FIG. 1 is that a parallel circuit including Zener diodes 80, a resistance 60, and an ammeter 70 connected in series is connected between the parallel circuit composed of the capacitor 20 and the counter 30 and the grounding terminal 50. The Zener diode 80 restricts the surge voltage of a positive wave and negative wave flowing at a fixed voltage when the lightening arrester is operated.

A leakage current (several mA) from the lightening arrester LA flows into the ground, through, the lightening arrester terminal 40, the capacitor 20, the resistance 60, and the ammeter 70. Accordingly, without preparing an exclusive measurement, the ammeter 70 measures the leakage current as an effective value and judges the deterioration of the lightening arrester LA easily.

(3) Third Embodiment

Figure 3:
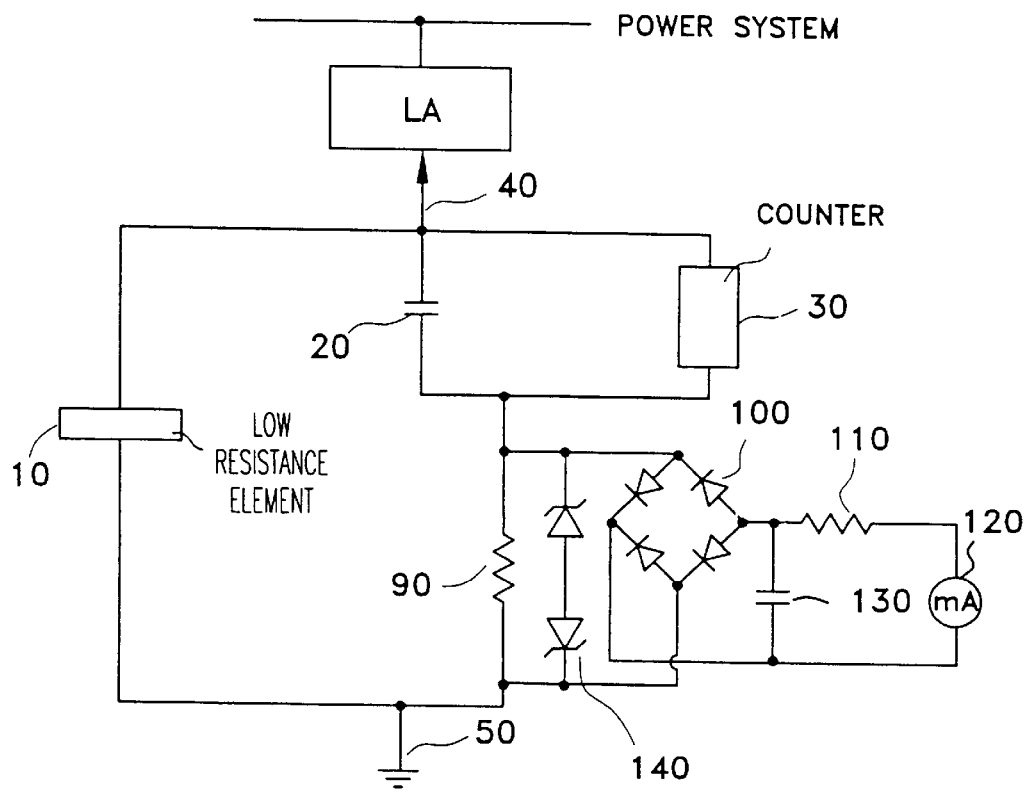
FIG. 3 is a circuit diagram of a discharge counter according to a third embodiment of the present invention.

FIG. 3 is a circuit diagram of a discharge counter based on the third embodiment.

In FIG. 3, the explanation about the low resistance ZnO element 10, the capacitor 20, the counter 30, the lightening arrester terminal 40, and the grounding terminal 50 is omitted because these elements are the same as in FIG. 1. The difference with FIG. 1, however, is that a resistance 90 is connected between the parallel circuit composed of the capacitor 20 and the counter 30 and the grounding terminal 50. Both terminals of the resistance 90 are connected to Zener diodes 140 in parallel and input terminals of a full wave rectitude or transmission wave apparatus 100.

Furthermore, output terminals of the transmission wave apparatus 100 are connected to a capacitor 130, and a serial circuit composed of a resistance 110 and an ammeter 120 is connected to the capacitor 130 in parallel.

The Zener diode 140 restrict a surge, voltage of a positive wave and negative wave flowing at a fixed voltage, when the lightening arrester operates.

A leakage current (several mA) from the lightening arrester LA flows into the ground, through, the lightening arrester terminal 40, the capacitor 20, and the resistance 90.

Then, the alternative voltage generated at both terminals of the resistance 90 is rectified to direct current by the transmission wave apparatus 100 and flows into the ammeter 120.

Accordingly, without preparing an exclusive measurement, the ammeter 120 measures the leakage current as an effective value and judges the deterioration of the lightening arrester LA easily.

(4) Fourth Embodiment

Figure 4:
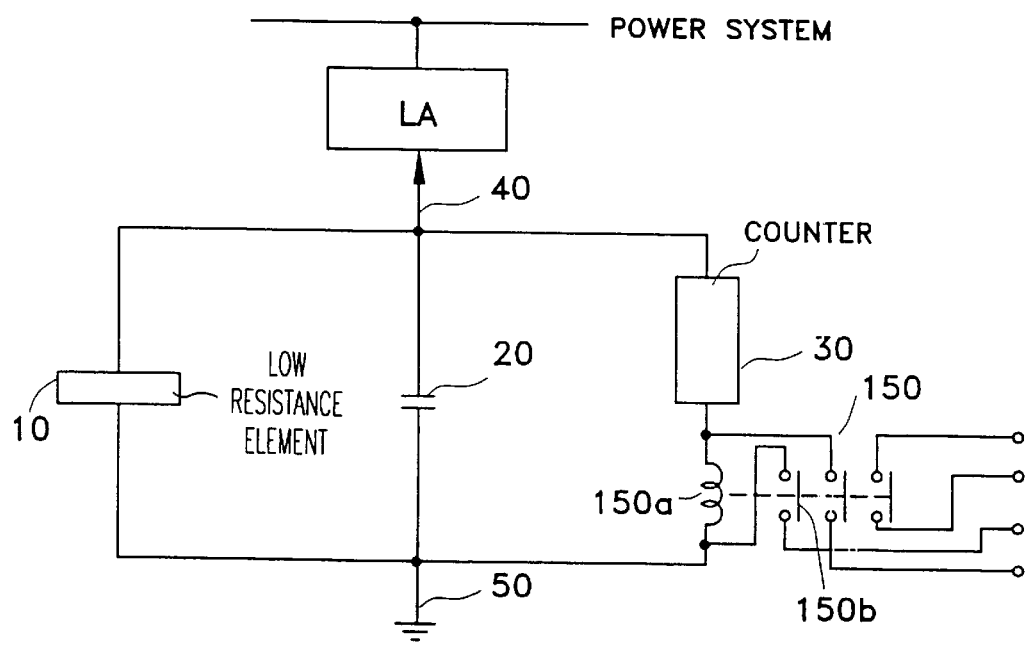
FIG. 4 is a circuit diagram of a discharge counter according to a fourth embodiment of the present invention.

FIG. 4 is a circuit diagram of the discharge counter based on the fourth embodiment.

In FIG. 4, the explanation about the low resistance ZnO element 10, the capacitor 20, counter 30, the lightening arrester terminal 40, and the grounding terminal 50 is omitted because these elements are the same as in FIG. 1.

The difference with FIG. 1 is that a relay 150 is connected between the counter 30 and the grounding terminal 50 in serial.

The relay 150 includes a coil 150a and plural contacts 150b and is closed by operation of the coil 150a. The output of these contacts 150b is displayed on an external display.

A leakage current (several mA) from the lightening arrester LA flows into the ground, through, the lightening arrester terminal 40, the low resistance ZnO element 10 and the grounding terminal 50. Then, the capacitor 20 is charged by the generation of the voltage based on the IR drop at the low resistance ZnO element 10. After charging the capacitor 20, the counter 30 functions by discharging the charged energy of the capacitor 20 though the counter 30 and the relay 150. Accordingly, the counter 30 counts the number of times the lightening arrester LA discharges.

It is possible to ascertain the operation of the lightening arrester LA from a distant location and simplify its maintenance, because the output of the contacts 150b based on the operation of the relay 150 is displayed on the external display.

(5) Fifth Embodiment

Figure 5:
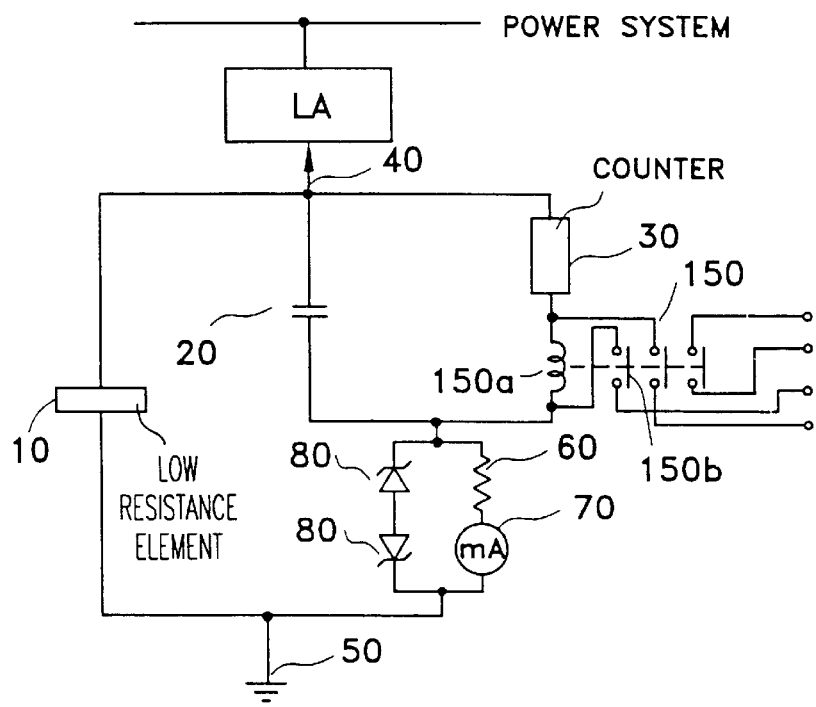
FIG. 5 is a circuit diagram of a discharge counter according to a fifth embodiment of the present invention.

FIG. 5 is a circuit diagram of the discharge counter based on the fifth embodiment.

In FIG. 5, the explanation about the low resistance ZnO element 10, the capacitor 20, counter 30, the lightening arrester terminal 40, the Zener diode 80, the resistance 60, the ammeter 70 and the grounding terminal 50 is omitted because these elements are the same as in FIG. 2.

The difference with FIG. 2 is that the relay 150 in FIG. 4 is connected to the counter 30 in serial.

The discharge current from the lightening arrester LA flows into the ground through the lightening arrester terminal 40, the low resistance ZnO element, and the grounding terminal 50.

Then, the capacitor 20 is charged by the generation of the voltage based on the IR drop at the low resistance ZnO element 10.

After the charging of the capacitor 20, the counter 30 functions by discharging the charged energy of the capacitor 20 though the counter and the relay 150, and the relay 150 is operated. Accordingly, the counter 30 counts the number of times the lightening arrester LA discharges.

It is possible to ascertain the operation of the lightening arrester LA from a distant location and simplify the maintenance of this apparatus, because the output of the contact 150b based on the operation of the relay 150 is displayed on the external display.

A leakage current (several mA) from the lightening arrester LA flows into the ground through the lightening arrester 40, the capacitor 20, the resistance 60, and the ammeter 70. Accordingly, without preparing an exclusive measurement, the ammeter 70 measures, the leakage current as an effective value and judges the deterioration of the lightening arrester LA easily.

(6) Sixth Embodiment

Figure 6:
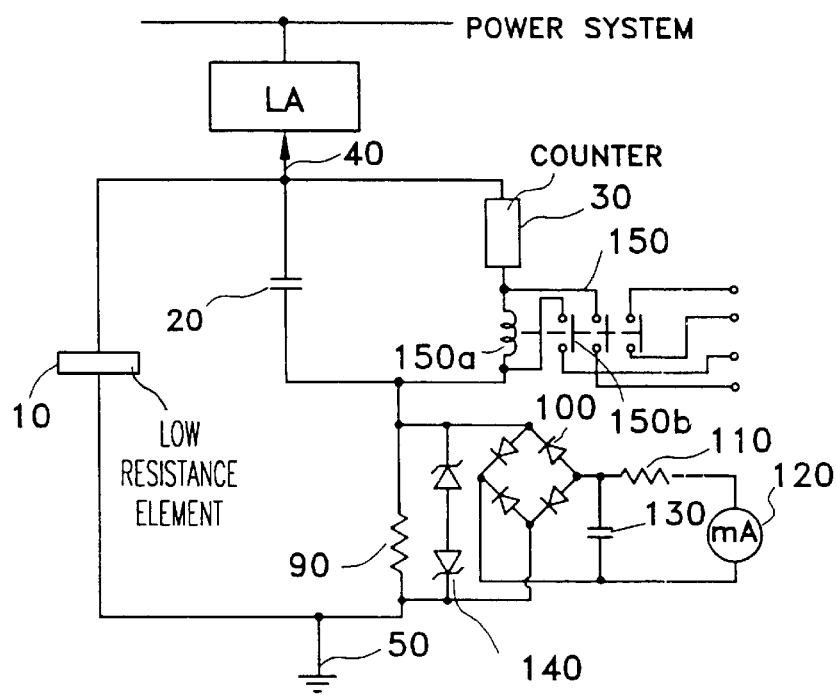
FIG. 6 is a circuit diagram of a discharge counter according to a sixth embodiment of the present invention.

FIG. 6 is a circuit diagram of the discharge counter based on the sixth embodiment.

In FIG. 6, the explanation about the low resistance ZnO element 10, the capacitor 20, counter 30, the relay 150, the lightening arrester terminal 40, and the grounding terminal 50 is omitted because these elements are the same as in FIG. 5.

The difference with FIG. 5 is that the circuit (composed of the resistance 90, the transmission wave apparatus 100, the resistance 110, the ammeter 120 and the capacitor 130 in FIG. 3) is connected, instead the parallel circuit composed of the Zener diode 80, the resistance 60, and the ammeter 70.

The discharge current from the lightening arrester LA flows into the ground through the lightening arrester terminal 40, the low resistance ZnO element 10, and the grounding terminal 50. The capacitor 20 is then charged by the generation of the voltage based on the IR drop at the low resistance ZnO element 10. After the charging of the capacitor 20, the counter 30 functions by discharging the charged energy of the capacitor 20 through the counter 30 and the relay 150, and the relay 150 is operated by the operation of the counter 30. Accordingly, the counter 30 counts the number of times the lightening arrester LA discharges.

It is possible to ascertain the operation of the lightening arrester LA from a distant location and simplify its maintenance, because the output of the contact 150b based on the operation of the relay 150 is displayed on the external display.

A leakage current (several mA) from the lightening arrester LA flows into the ground through the lightening arrester 40, the capacitor 20, the resistance 90 and the ammeter 70. Then, the alternative voltage generated at both terminals of the resistance 90 is rectified to direct current by the transmission wave apparatus 100 and flow into the ammeter 120. Accordingly, without preparing an exclusive measurement, the ammeter 70 measures the leakage current as an effective value and judges the deterioration of the lightening arrester LA easily.

Next, embodiments to which a nonlinear resistance applied to the mentioned embodiment of the discharge counter will be explained.

(1) First Embodiment

A nonlinear resistance according to a first embodiment of the present invention will be explained with reference to FIG. 11 and Table 1 hereinafter.

Figure 11:
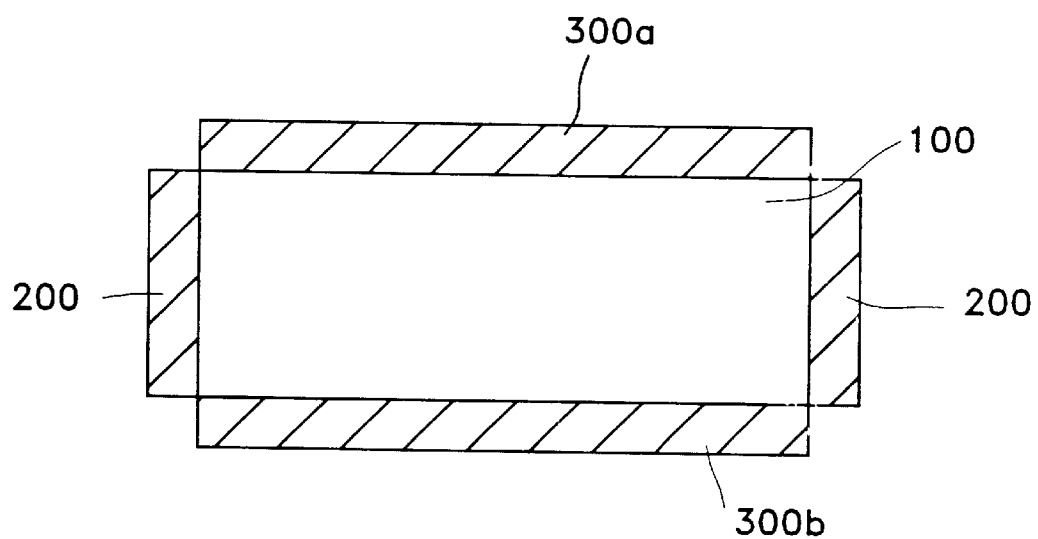
FIG. 11 is sectional view showing the nonlinear resistor according to a first embodiment of the present invention.

FIG. 11 is a sectional view showing a nonlinear resistance according to the present invention. As shown in FIG. 11, this nonlinear resistor has a sintered body 100 that includes zinc oxide as a main component.

This sintered body 100 has a pair of electrodes on an upper surface 300a, a lower surface 300b, and a side surface 200.

Even high resistant insulating layer is put on the side surface 200.

Next, a method of manufacturing the nonlinear resistance according to the first embodiment will be explained.

To begin with, material of the nonlinear resistor is prepared by adding bismuth oxide (hereinafter referred to as "$Bi_2O_3$"), antimony oxide (hereinafter referred to as "$Sb_2O_3$") and titanium oxide (hereinafter referred to as "$TiO_2$") as metal oxide to zinc oxide (hereinafter referred to as "ZnO") as a main component.

Such material as well as water, organic dispersing agent, and binders are then put into a mixer and mixed. The resulting mixture is then sprayed by a spray dryer to granulate (to a diameter of 100 $\mu$m).

Then, such granulated powders are placed in a mold to be pressed, so that a circular plate which has a diameter of 100 mm and a thickness of 30 mm is formed. The pressed body is then sintered at 1200° C. for two hours to get the sintered body 100 (see FIG. 11).

Subsequently, the material of the insulating layer is coated on the sintered body 100, and then a side surface insulating layer 200a is formed on the side surface 200 by firing. The upper surface 300a and a lower surface 300b are then polished respectively, and a guardmask is covered on the sintered body 100 and polished.

The electrodes are then formed on the polished upper surface 300a and a lower surface 300b. As above, the nonlinear resistor can be fabricated.

Next, the characteristics of the nonlinear resistance according to a first embodiment of the present invention will be explained.

Table 1 shows a varistor voltage (hereinafter referred to as "V1 mA"), a discharge tolerance, and a nonlinear characteristic. In other words, Table 1 shows the test results of both the sample related to the first example to the sixteenth example, and comparative samples from first comparative example to the sixth comparative example.

The comparative quality of each example is determined based on the following standards:
1) the varistor voltage: 20–150 (v/mm)
2) the discharge tolerance characteristic: more than 120 (kA)
3) the nonlinear characteristic: approximately 1.5 (V5 kA/V1 mA)

Here, the discharge tolerance characteristic shows the current value which the nonlinear resistance withstood when a value of lightening impulse current (4/10) based on the lightening is applied to 200 pieces of the nonlinear resistor, being increased gradually.

Here, (4/10) means a waveform, the rise time of which is 4 μsec, the time in which the peak value will be reduced to half after the current passed the peak is 10 μsec.

Each nonlinear resistance which has a different component is tested by changing its thickness under the same V1 mA.

The discharge tolerance test is applied to nonlinear resistance as shown on Table 1 by changing their thickness under the same V1 mA.

The nonlinear characteristic is shown by using the ratio (determined as "V5 kA/V1 mA") between the voltage based on 5 kA current (determined as "V5 kA") and V1 mA.

Examples 1–6 in Table 1 show characteristics of the above mentioned three standards, when the ratio of $Bi_2O_3$ changes under $Sb_2O_3$, $TiO_2$ (1 mol %). According to Table 1, Examples 1–6 are judged to be better compositions.

Examples 7–11 in Table 1 show characteristics of the above mentioned three standards, when the ratio of $Sb_2O_3$ changes under $Bi_2O_3$, $TiO_2$ (1 mol %). According to Table 1, Examples 1–6 are judged to be better compositions.

Examples 12–13 in Table 1 show characteristics of the above mentioned three standards, when the ratio of $TiO_2$ changes under $Bi_2O_3$, $Sb_2O_3$ (1 mol %). According to Table 1, Examples 1–6 are judged as better compositions.

As shown in Table 1, the V1 mA of each nonlinear resistor is in the range of 20–150 (V/mm), and the discharge tolerance is over 120 kA, compared to 80 kA in the conventional art.

When antimony oxide is put into the above mentioned nonlinear resistors (1 mol/%) as a metal oxide, the same effect is expected.

(2) Second Embodiment

FIG. 12 is a graph showing the relationship between a nonlinear characteristic and the amount of CoO added to the element.

To begin with, material of the nonlinear resistor is prepared by adding bismuth oxide ("$Bi_2O_3$"), titanium oxide (determined as "$TiO_2$"), cobalt oxide ("CoO"), antimony oxide ("$Sb_2O_3$"), as a metal oxide to zinc oxide ("ZnO") as a main component.

EXAMPLE $Bi_2O_3$,$TiO_2$,$Sb_2O_3$; 1: mol % (fixed)
CoO; 0.1–20: mol % (test range)

An explanation about a method of manufacturing the nonlinear resistance is omitted because the method is the same as the first embodiment related to the nonlinear resistance.

According to FIG. 12, the range of 0.1–5.0 (mol %) of CoO is better.

As a result, the discharge tolerance characteristic is improved as in the first embodiment related to the nonlinear resistance.

Because the V1 mA is in the range of 20–150 (V/mm)

The nonlinear characteristic is shown by using the rate (determined as V5 kA/V1 mA) between the voltage based on 5 kA current (determined as "V5 kA") and V1 mA.

The horizontal axis shows the amount of CoO by a logarithmic scale, and the vertical axis shows V5 kA/V1 mA of the nonlinear characteristic.

As shown result of FIG. 12, the nonlinear characteristic is improved over the first embodiment related to the nonlinear resistance.

As a component of the nonlinear resistance, the same effect is expected under the following component.

EXAMPLE $Bi_2O_3$,$TiO_2$,$Sb_2O_3$,CoO: 0.1–5.0 (mol %) (valid range)

(3) Third Embodiment

FIG. 13 is a graph showing the relationship between a nonlinear characteristic and the amount of MnO added to the element.

To begin with, the material of the nonlinear resistance is prepared by adding bismuth oxide ("$Bi_2O_3$"), titanium oxide ("$TiO_2$"), manganese dioxide ("MnO"), antimony oxide ("$Sb_2$3"), as a metal oxide to zinc oxide ("ZnO") as a main component.

EXAMPLE $Bi_2O_3$,$TiO_2$,$Sb_2O_3$; 1: mol % (fixed)
MnO; 0.1–20: mol % (test range)

An explanation about a method of manufacturing the nonlinear resistance is omitted because the method is as same as in the first embodiment related to the nonlinear resistance.

According to FIG. 13, the range of 0.1–5.0 (mol %) of MnO is better. As a result, the discharge tolerance characteristic is improved over the first embodiment because the V1 mA is in the range of 20–150 (V/mm).

The nonlinear characteristic is shown by using the ratio ("V5 kA/V1 mA") between the voltage based on 5 kA current ("V5 kA") and V1 mA.

The horizontal axis shows the amount of MnO by a logarithmic scale, and the vertical axis shows V5 kA/V1 mA of the nonlinear characteristic.

As shown in FIG. 13, the nonlinear characteristic is improved over the first embodiment related to the nonlinear resistance.

As a component of the nonlinear resistance, the same effect is expected under the following component.

EXAMPLE $Bi_2O_3$,$TiO_2$,$Sb_2O_3$,MnO; 0.1–5.0: mol % (valid range)
CoO; less than 5.0: mol % (valid range)

(4) Fourth Embodiment

FIG. 14 is a graph showing the relationship between a nonlinear characteristic and the amount of NiO added to the element.

To begin with, material of the nonlinear resistance is prepared by adding bismuth oxide ("$Bi_2O_3$") titanium oxide ("$TiO_2$"), nickel oxide ("NiO"), antimony oxide (determined as "$Sb_2O_3$"), as a metal oxide to zinc oxide ("ZnO") as a main component.

EXAMPLE $Bi_2O_3$,$TiO_2$, $Sb_2O_3$; 1: mol % (fixed)
NiO; 0.1–5.0: mol % (test range)

An explanation about a method of manufacturing the nonlinear resistance is omitted because the method is the same as in the first embodiment related to the nonlinear resistance.

According to FIG. 14, the range of 0.1–5.0 (mol %) of NiO is better. As a result, the discharge tolerance characteristic is improved as in the first embodiment related to the nonlinear resistance. This is because the V1 mA is in the range of 20–150 (V/mm).

The nonlinear characteristic is shown by using the rate (determined as "V5 kA/V1 mA") between the voltage based on 5 kA current (determined as "V5 kA") and V1 mA.

The horizontal axis shows the amount of NiO by a logarithmic scale, and the vertical axis shows V5 kA/V1 mA of the nonlinear characteristic. As shown in FIG. 14, the nonlinear characteristic is improved over the first embodiment related to the nonlinear resistance.

As a component of the nonlinear resistance, the same effect is expected using the following component.

EXAMPLE $Bi_2O_3$,$TiO_2$,$Sb_2O_3$,NiO; 0.1–5.0: mol % (valid range)
MnO,CoO; 5.0: mol %

(5) Fifth Embodiment

FIG. 15 is a graph showing the relationship between a nonlinear characteristic and the amount of $Al_2O_3$ added to the element.

To begin with, material of the nonlinear resistor is prepared by adding bismuth oxide ("$Bi_2O_3$"), titanium oxide ("$TiO_2$"), aluminum oxide ("$Al_2O_3$"), antimony oxide ("$Sb_2O_3$"), and as a metal oxide to zinc oxide ("ZnO") as a main component.

EXAMPLE $Bi_2O_3$,$TiO_2$,$Sb_2O_3$; 1: mol % (fixed)
$Al_2O_3$; $0.1*10^{-3}$–$100*10^{-3}$: mol % (test range)

An explanation about a method of manufacturing the nonlinear resistance is omitted because the method is the same as in the first embodiment related to the nonlinear resistance.

According to FIG. 15, the range of $0.5*10^{-3}$–$20\ 10^{-3}$ (mol %) of $Al_2O_3$ is better.

As a result, the discharge tolerance characteristic is improved as well as in the first embodiment related to the nonlinear resistance, because the V1 mA is in the range of 20–150 (V/mm).

The nonlinear characteristic is shown by using the ratio (determined as "V5 kA/V1 mA") between the voltage based on 5 kA current (determined as "V5 kA") and V1 mA.

The horizontal axis shows the amount of $Al_2O_3$ by a logarithmic scale, and the vertical axis shows V5 kA/V1 mA of the nonlinear characteristic.

As shown result in the FIG. 15, the nonlinear characteristic is improved over the first embodiment.

As a component of the nonlinear resistance, the same effect is expected under the following component.

EXAMPLE $Bi_2O_3$,$TiO_2$,$Sb_2O_3$; 0.1–5.0: mol % (valid range)
MnO,CoO; less than 5.0: mol % (valid range)
$Al_2O_3$; $0.5*10^{-3}$–$20*10^{-3}$: mol % (valid range)

(6) Sixth Embodiment

Figure 16:
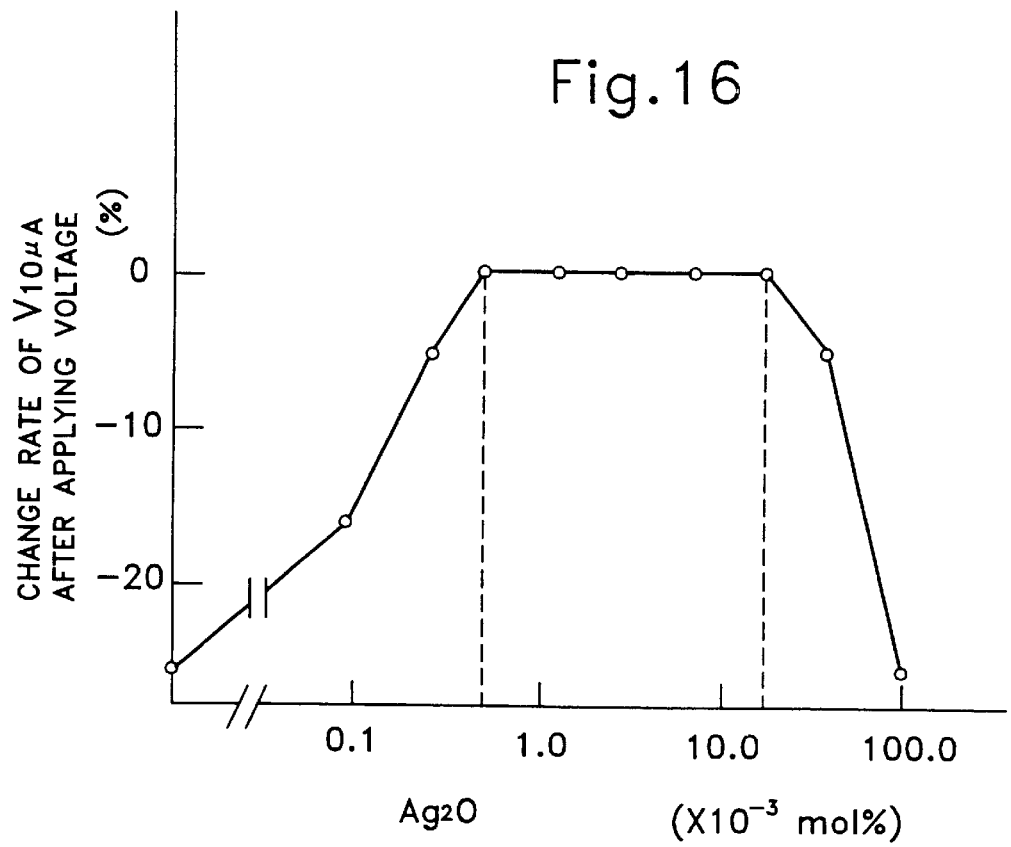
FIG. 16 is a graph showing the relationship between a nonlinear characteristic and on increasing in the amount of a $Ag_2O$.

FIG. 16 is a graph showing the relationship between a nonlinear characteristic and an amount of $Ag_2O_3$ added to the element.

To begin with, the material of the nonlinear resistance is prepared by adding bismuth oxide ("$Bi_2O_3$"), titanium oxide ("$TiO_2$"), silver oxide ("$Ag_2O_3$"), antimony oxide ("$Sb_2O_3$"), as a metal oxide to zinc oxide ("ZnO") as a main component.

EXAMPLE $Bi_2O_3$,$TiO_2$, $Sb_2O_3$; 1: mol % (fixed)
$Ag_2O_3$; $0.1*10^{-3}$–$100*10^{-3}$: mol % (test range)

An explanation about the method of manufacturing the nonlinear resistance is omitted because the method is the same as in the first embodiment related to the nonlinear resistance.

According to FIG. 16, the range of $0.5*10^{-3}$–$20*10^{-3}$ (mol %) of $Ag_2O_3$ is better.

As a result, the discharge tolerance characteristic is improved as well as in the first embodiment related to the nonlinear resistor, because the V1 mA is the range of 20–150 (V/mm).

FIG. 16 shows a lifetime characteristic of the nonlinear resistance.

The horizontal axis shows the amount of $Ag_2O_3$ by a logarithmic scale, and the vertical axis shows the ratio of the variable of V10 µA when the amount of $Ag_2O$ added is changed under 10 µA. The life time characteristic is used to know the longterm stability.

FIG. 16 shows the lifetime characteristic that the nonlinear resistance is applied for 500 hours applying a voltage ratio of 100% at 120° C. As a result of FIG. 16, the life time characteristic is improved over that of the first embodiment related to the nonlinear resistance.

As a component of the nonlinear resistance, the same effect is expected under the following component.

EXAMPLE $Bi_2O_3$,$TiO_2$,$Sb_2O_3$; 0.1–5.0: mol % (valid range)
MnO,CoO,NiO; less than 5.0: mol % (valid range)
$Ag_2O$; less $20*10^{-3}$: mol % (valid)

(7) Seventh Embodiment

Figure 17:
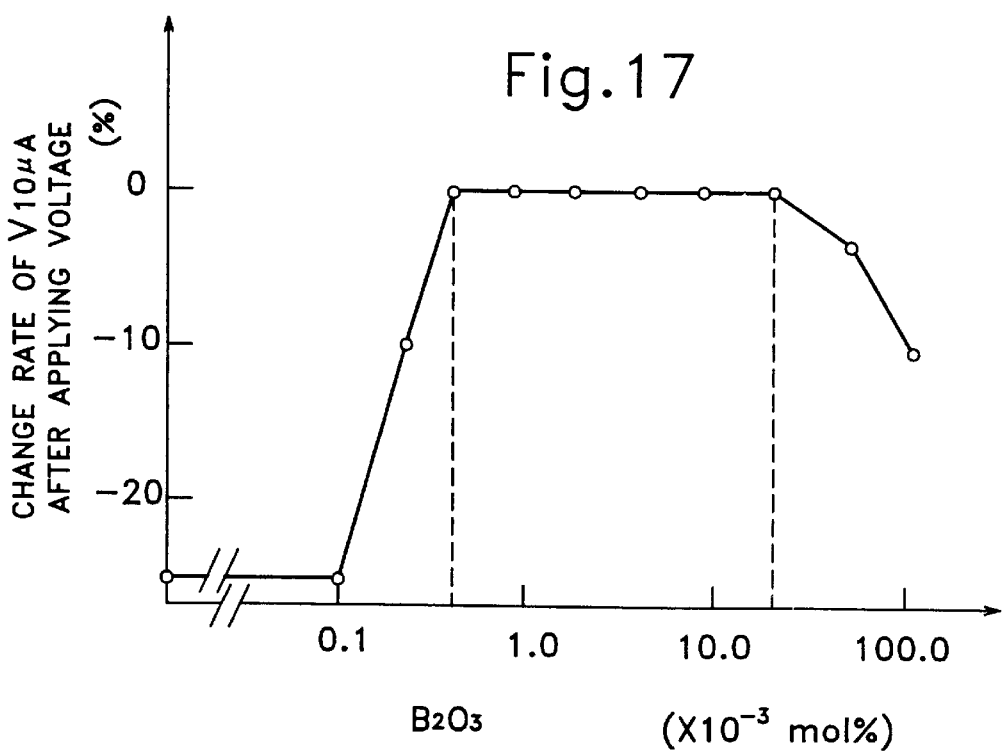
FIG. 17 is a graph showing the relationship between a nonlinear characteristic and on increasing in the amount of a $B_2O_3$.

FIG. 17 is a graph showing the relationship between a nonlinear characteristic.

To begin with, material of the nonlinear resistance is prepared by adding bismuth oxide ("$Bi_2O_3$"), titanium oxide ("$TiO_2$"), boric oxide ("$B_2O_3$"), antimony oxide ("$Sb_2O_3$"), as a metal oxide to zinc oxide ("ZnO") as a main component.

EXAMPLE $Bi_2O_3$,$TiO_2$,$Sb_2O_3$; 1: mol % (fixed)
$B_2O_3$; $0.1*10^{-3}$–$100*10^{-3}$: mol % (test range)

An explanation about the method of manufacturing the nonlinear resistance is omitted because the method is the same as in the first embodiment related to the nonlinear resistance.

According to FIG. 17, the range of $0.5*10^{-3}$–$20*10^{-3}$ (mol %) of $B_2O_3$ is better. As a result, both the discharge tolerance characteristic and the nonlinear characteristic are improved, because the V1 mA is in the range of 20–150 (V/mm).

FIG. 17 shows a lifetime characteristic of the nonlinear resistance. The horizontal axis shows the amount of $B_2O_3$ by a logarithmic scale, and the vertical axis shows ratio of variable of V10 µA when amount of $B_2O_3$ added is changed under 10 µA.

FIG. 17 shows the lifetime characteristic where the nonlinear resistance is applied for 500 hours under an applied current ratio of 100% at 120° C.

That is to say, the lifetime characteristic is improved in terms of performance when compared with the first embodiment related to the nonlinear resistance.

As a component of the nonlinear resistance, the same effect is expected under the following component.

EXAMPLE $Bi_2O_3$,$TiO_2$,$Sb_2O_3$: 0.1–5.0 mol % (valid range)
MnO,CoO,NiO; less than 5.0: mol % (valid range)

Al$_2$O$_3$; less than 20*10$^{-3}$: mol % (valid range)

B$_2$O$_3$; 0.5*10$^{-3}$–20*10$^{-3}$: mol % (valid range)

(8) Eighth Embodiment

Figure 18:
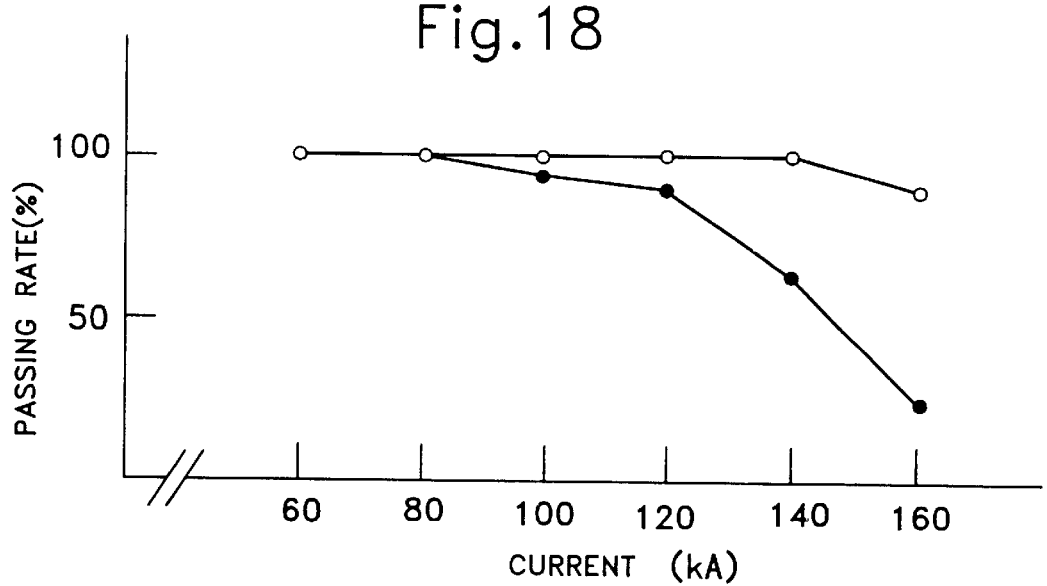
FIG. 18 is a graph showing a discharge tolerance characteristic.

FIG. 18 is a graph showing the relationship between a nonlinear characteristic.

To begin with, material of the nonlinear resistance is prepared by adding bismuth oxide ("Bi$_2$O$_3$"), titanium oxide ("TiO$_2$"), antimony oxide ("Sb$_2$O$_3$"), as a metal oxide to zinc oxide ("ZnO") as a main component.

EXAMPLE

Bi$_2$O$_3$,TiO$_2$,Sb$_2$O$_3$; 1: mol % (valid)

As the method of manufacturing the nonlinear resistance is almost the same as in the first embodiment related to the nonlinear resistance. Therefore, only a different process is only explained here. That is to say, after sintering at 1200° C., the sintered body 100 is heated at approximately 450° C.–500° C.

After this treatment, the material of the insulating layer insulator is coated on the sintered body 100, and then side surface insulating layers 200a are formed on the side surface 200 by firing. Then, the upper surface 300a and a lower surface 300b are polished respectively, and a guardmask is placed on the sintered body 100 and polished. The electrodes are then formed on the polished upper surface 300a and a lower surface 300b.

As above, the nonlinear resistance can be fabricated as in the first embodiment related to the nonlinear resistance.

As a result of X ray diffraction of the nonlinear resistance formed by the above method, the existence of a cubic system bismuth oxide is ascertained. On the other hand, in the EXAMPLE of non burning, the existence of a monoclinic system bismuth oxide is ascertained.

As a result, the nonlinear characteristics are improved as well as in the first embodiment related to the nonlinear resistor because the V1 mA is in the range of approximately 3.0–150 (V/mm).

FIG. 18 shows the discharge tolerance characteristic of the nonlinear resistance. The discharge tolerance characteristic shows the current value in which the nonlinear resistance tolerance when a value of lightening impulse current (4/10) based on the lightening is applied to 20 pieces of the nonlinear resistance, being increased gradually.

The figures on FIG. 8 are on an average.

The nonlinear characteristic is improved when compared to a conventional material, referring to in FIG. 18. The reason four the improvement in the discharge tolerance characteristic is based on the following explanations.

The microscopic structure of the nonlinear resistor is composed of a ZnO crystal particle in the range of around 10 μm and with a ground boundary layer coating. In the ground boundary layer of the conventional material, the existence of a monoclinic system bismuth oxide is ascertained. In the ground boundary layer of this embodiment, the existence of a cubic system bismuth oxide is ascertained.

As above, the strength of the nonlinear resistor is decided by a surface strength between the ZnO crystal particle and the ground boundary layer coating this ZnO crystal particle.

The strength for a breakdown test shows that the surface strength between ZnO and a cubic system bismuth oxide is stronger than that between ZnO and a monoclinic system bismuth oxide.

As mentioned above, the existence of the cubic system bismuth oxide make the mechanical strength stronger.

So, this nonlinear resistance can tolerance a thermal stress generated by applied current and the discharge tolerance characteristic is also improved.

As a component of the nonlinear resistance, the same effect is expected under the following component.

EXAMPLE

Bi$_2$O$_3$,TiO$_2$,Sb$_2$O$_3$; 0.1–5.0: mol % (valid range)

MnO,CoO,NiO; less than 5.0: mol % (valid range)

Al$_2$O$_3$; less than 20*10$^{-3}$: mol % (valid range)

B$_2$O$_3$; 0.5*10$^{-3}$–20*10$^{-3}$: mol % (valid range)

Next, other embodiments are explained with reference to Table 2.

(9) Ninth Embodiment

A ninth embodiment is the EXAMPLE that does not include Sb$_2$O$_3$ in the second embodiment related to the nonlinear resistance.

The ninth embodiment achieves the same effects the second embodiment related to the nonlinear resistance.

An explanation about the method of manufacturing the nonlinear resistance is omitted because the method is the same as in the first embodiment related to the nonlinear resistance.

As a component of the nonlinear resistor, the same effect as in the above mentioned embodiment is expected using the following component.

EXAMPLE

Bi$_2$O$_3$,TiO$_2$; 0.1–5.0: mol % (valid range)

(10) Tenth Embodiment

A tenth embodiment is the EXAMPLE that does not include Sb$_2$O$_3$ in the third embodiment related to the nonlinear resistance.

The tenth embodiment achieves the same effect as the third embodiment related to the nonlinear resistance.

An explanation about a method of manufacturing the nonlinear resistance is omitted because the method is as same as in the first embodiment related to the nonlinear resistance.

As a component of the nonlinear resistance, the same effect is expected under the following components.

EXAMPLE 1

Bi$_2$O$_3$,TiO$_2$,MnO; 0.1–5.0: mol % (valid range)

EXAMPLE 2

Bi$_2$O$_3$,TiO$_2$,MnO,CoO; 0.1–5.0: mol % (valid range)

(11) Eleventh Embodiment

An eleventh embodiment is the EXAMPLE that does not include Sb$_2$O$_3$ in the fourth embodiment related to the nonlinear resistance.

The eleventh embodiment achieves the same effect as in the fourth embodiment related to the nonlinear resistance.

An explanation about a method of manufacturing the nonlinear resistance is omitted because the method is the same as in the first embodiment related to the nonlinear resistance.

As a component of the nonlinear resistance, the same effect is expected using the following components.

EXAMPLE 1

Bi$_2$O$_3$,TiO$_2$,NiO; 0.1–5.0: mol % (valid range)

EXAMPLE 2

$Bi_2O_3, TiO_2, NiO, CoO$; 0.1–5.0: mol % (valid range)

EXAMPLE 3

$Bi_2O_3, TiO_2, NiO, CoO, MnO$; 0.1–5.0: mol % (valid range)

(12) Twelfth Embodiment

A twelfth embodiment is the EXAMPLE that does not include $Sb_2O_3$ in the fifth embodiment related to the nonlinear resistance.

The twelfth embodiment achieves the same effect as in the fifth embodiment related to the nonlinear resistance.

An explanation about a method of manufacturing the nonlinear resistance is omitted because the method is the same as in the first embodiment related to the nonlinear resistance.

As a component of the nonlinear resistance, the same effect is expected using the following components.

EXAMPLE 1

$Bi_2O_3, TiO_2, NiO$; 0.1–5.0: mol % (valid range)
$Al_2O_3$; $0.5*10^{-3}$–$20*10^{-3}$: mol % (valid range)

EXAMPLE 2

$Bi_2O_3, TiO_2, CoO$; 0.1–5.0: mol % (valid range)
$Al_2O_3$; $0.5*10^{-3}$–$20*10^{-3}$: mol % (valid range)

EXAMPLE 3

$Bi_2O_3, TiO_2, CoO, MnO$; 0.1–5.0: mol % (valid range)
$Al_2O_3$; $0.5*10^{-3}$–$20*10^{-3}$: mol % (valid range)

EXAMPLE 4

$Bi_2O_3, TiO_2, NiO, CoO, MnO$; 0.1–5.0: mol % (valid range)
$Al_2O_3$; $0.5*10^{-3}$–$20*10^{-3}$: mol % (valid range)

(13) Thirteenth Embodiment

A thirteenth embodiment is the EXAMPLE that does not include $Sb_2O_3$ in the sixth embodiment related to the nonlinear resistance.

The thirteenth embodiment achieves the same effect as the sixth embodiment related to the nonlinear resistance. An explanation about a method of manufacturing the nonlinear resistance is omitted because the method is the same as in the first embodiment related to the nonlinear resistance.

As a component of the nonlinear resistance, the same effect is expected using the following components.

EXAMPLE 1

$Bi_2O_3, TiO_2$; 0.1–5.0: mol % (valid range)
$CoO, MnO, NiO$; less than 5.0: mol % (valid range)
$Al_2O_3$; $20*10^{-3}$: mol % (valid range)
$Ag_2O$; $0.5*10^{-3}$–$20*10^{-3}$: mol % (valid range)

(14) Fourteenth Embodiment

A fourteenth embodiment is the EXAMPLE that does not include $Sb_2O_3$ in the seventh embodiment related to the nonlinear resistance.

The fourteenth embodiment achieves the same effect as the seventh embodiment related to the nonlinear resistance. An explanation about a method of manufacturing the nonlinear resistance is omitted because the method is as same as in the first embodiment related to the nonlinear resistance.

As a component of the nonlinear resistance, the same effect is expected using the following component.

EXAMPLE 1

$Bi_2O_3, TiO_2$; 0.1–5.0: mol % (valid range)
$CoO, MnO, NiO$; less than 5.0: mol % (valid range)
$Al_2O_3, Ag_2O$; less than $20*10^{-3}$: mol % (valid range)

(15) Fifteenth Embodiment

A fifteenth embodiment is the EXAMPLE that does not include $Sb_2O_3$ in the eighth embodiment related to the nonlinear resistance.

The fifteenth embodiment achieves the same effect as the eighth embodiment related to the nonlinear resistance.

An explanation about a method of manufacturing the nonlinear resistance is omitted because the method is the same as in the first embodiment related to the nonlinear resistance.

The material added to zinc oxide as a main component is not limited to the oxides mentioned using in the first through the fifteenth embodiment. In other words, whatever method will be an oxide after firing can be used as an adding to zinc oxide, and the same effect will be achieved as well as the mentioned embodiment.

According to this invention, it is possible to provide a discharge counter which has a similar component and high reliability. It is possible to provide a nonlinear resistance, which is applied to the discharge counter and has excellent discharge tolerance characteristics, life time characteristics, and non-linear characteristics.

Obviously, numerous modifications and variations of the present invention are possible in lightening of the above teachings. It is therefore to be understood that within the scope of the appended claims, the invention may be practiced otherwise than as specifically described herein.

TABLE 1

| NO | Composition (mol %) to ZnO | | | varistor voltage (V/mm) | discharge withstand characteristic (kA) | nonlinear characteristic (V5kA/V1mA) |
|---|---|---|---|---|---|---|
|  | $Bi_2O_3$ | $Sb_2O_3$ | $TiO_2$ |  |  |  |
| COMPARATIVE EXAMPLE 1 | 0.05 | 1.0 | 1.0 | 208 | 80 | 1.98 |
| EXAMPLE 1 | 0.1 | 1.0 | 1.0 | 148 | 120 | 1.58 |
| EXAMPLE 2 | 1.5 | 1.0 | 1.0 | 105 | 132 | 1.56 |
| EXAMPLE 3 | 0.8 | 1.0 | 1.0 | 72 | 130 | 1.55 |
| EXAMPLE 4 | 1.0 | 1.0 | 1.0 | 48 | 135 | 1.52 |
| EXAMPLE 5 | 2.0 | 1.0 | 1.0 | 25 | 140 | 1.50 |
| EXAMPLE 6 | 5.0 | 1.0 | 1.0 | 22 | 142 | 1.55 |
| COMPARATIVE EXAMPLE 2 | 8.0 | 1.0 | 1.0 | 21 | 98 | 1.88 |

TABLE 1-continued

| NO | Composition (mol %) to ZnO | | | varistor voltage (V/mm) | discharge withstand characteristic (kA) | nonlinear characteristic (V5kA/V1mA) |
|---|---|---|---|---|---|---|
| | $Bi_2O_3$ | $Sb_2O_3$ | $TiO_2$ | | | |
| COMPARATIVE EXAMPLE 3 | 1.0 | 0.05 | 1.0 | 23 | 95 | 1.95 |
| EXAMPLE 7 | 1.0 | 0.1 | 1.0 | 30 | 130 | 1.55 |
| EXAMPLE 8 | 1.0 | 0.5 | 1.0 | 48 | 135 | 1.52 |
| EXAMPLE 9 | 1.0 | 0.8 | 1.0 | 62 | 140 | 1.52 |
| EXAMPLE 10 | 1.0 | 2.0 | 1.0 | 92 | 138 | 1.50 |
| EXAMPLE 11 | 1.0 | 5.0 | 1.0 | 135 | 132 | 1.55 |
| COMPARATIVE EXAMPLE 4 | 1.0 | 1.0 | 0.05 | 205 | 88 | 1.88 |
| EXAMPLE 12 | 1.0 | 1.0 | 0.1 | 158 | 135 | 1.58 |
| EXAMPLE 13 | 1.0 | 1.0 | 0.5 | 112 | 138 | 1.55 |
| COMPARATIVE EXAMPLE 5 | 1.0 | 8.0 | 1.0 | 180 | 92 | 1.85 |
| COMPARATIVE EXAMPLE 6 | 1.0 | 1.0 | 8.0 | 25 | 100 | 1.90 |

TABLE 2

| NO | Composition (mol %) to ZnO | | varistor voltage (V/mm) | discharge withstand characteristic (kA) | nonlinear characteristic (V5kA/V1mA) |
|---|---|---|---|---|---|
| | $Bi_2O_3$ | $TiO_2$ | | | |
| COMPARATIVE EXAMPLE 1 | 0.05 | 1.0 | 135 | 88 | 1.92 |
| EXAMPLE 1 | 0.1 | 1.0 | 102 | 119 | 1.60 |
| EXAMPLE 2 | 0.5 | 1.0 | 72 | 125 | 1.56 |
| EXAMPLE 3 | 0.8 | 1.0 | 58 | 122 | 1.55 |
| EXAMPLE 4 | 1.0 | 1.0 | 45 | 120 | 1.52 |
| EXAMPLE 5 | 2.0 | 1.0 | 28 | 120 | 1.59 |
| EXAMPLE 6 | 5.0 | 1.0 | 20 | 118 | 1.61 |
| COMPARATIVE EXAMPLE 2 | 8.0 | 1.0 | 21 | 92 | 1.88 |
| EXAMPLE 7 | 1.0 | 0.1 | 85 | 120 | 1.61 |
| COMPARATIVE EXAMPLE 3 | 1.0 | 0.05 | 114 | 78 | 1.95 |
| EXAMPLE 8 | 1.0 | 0.5 | 55 | 128 | 1.58 |
| EXAMPLE 9 | 1.0 | 1.0 | 32 | 130 | 1.55 |
| EXAMPLE 10 | 1.0 | 2.0 | 20 | 123 | 1.56 |
| EXAMPLE 11 | 1.0 | 5.0 | 21 | 119 | 1.59 |
| COMPARATIVE EXAMPLE 4 | 1.0 | 8.0 | 22 | 81 | 1.82 |

What is claimed is:

1. A nonlinear resistance composition comprising:
   zinc oxide as a major component;
   bismuth oxide present at 0.1–5.0: mol % of said zinc oxide, titanium oxide present at 0.1–5.0: mol % of said zinc oxide, and silver oxide present at $0.5*10^{-3}$–$20*10^{-3}$: mol % of said zinc oxide.

2. A nonlinear resistance composition comprising:
   zinc oxide as a major component;
   bismuth oxide present at 0.1–5.0: mol % of said zinc oxide;
   titanium oxide present at 0.1–5.0 mol % of said zinc oxide,
   antimony oxide present at 0.1–5.0: mol % of said zinc oxide, and
   silver oxide present at $0.5*10^{-3}$–$20*10^{-3}$: mol % of said zinc oxide.

3. The nonlinear resistance composition according to claim 1 or 2, further comprising:
   cobalt oxide present at 0.1–5.0: mol % of said zinc oxide.

4. The nonlinear resistance composition according to claim 1 or 2, further comprising:
   manganese oxide present at 0.1–5.0: mol % of said zinc oxide.

5. The nonlinear resistance composition according to claim 1 or 2, further comprising:
   nickel oxide present at 0.1–5.0: mol % of said zinc oxide.

6. The nonlinear resistance composition according to claim 1 or 2, further comprising:
   aluminum oxide present at $0.5*10^{-3}$–$20*10^{-3}$: mol % of said zinc oxide.

7. The nonlinear resistance composition according to claim 6, wherein:
   the nonlinear resistor comprises a cubic system bismuth oxide and said zinc oxide.

8. The nonlinear resistance composition according to claim 1 or 2, further comprising:
   boric oxide present at $0.5*10^{-3}$–$20*10^{-3}$: mol % of said zinc oxide.

* * * * *